United States Patent [19]

Shishiguchi

[11] Patent Number: 5,773,357
[45] Date of Patent: Jun. 30, 1998

[54] METHOD FOR PRODUCING SILICON FILM TO BURY CONTACT HOLE

[75] Inventor: Seiichi Shishiguchi, Tokyo, Japan

[73] Assignee: NEC Corporation, Tokyo, Japan

[21] Appl. No.: 591,795

[22] Filed: Jan. 25, 1996

[30] Foreign Application Priority Data

Jan. 25, 1995 [JP] Japan .................................. 7-009842

[51] Int. Cl.$^6$ .................................................. H01L 21/28
[52] U.S. Cl. ........................ 438/479; 438/482; 438/488; 438/607; 438/639; 438/675
[58] Field of Search .................................. 437/101, 186, 437/191, 195, 203, 228, 233; 438/479, 478, 482, 488, 607, 639, 675

[56] References Cited

U.S. PATENT DOCUMENTS

| 4,716,048 | 12/1987 | Ishihara et al. | 437/233 |
| 5,183,781 | 2/1993 | Nakano | 437/191 |

FOREIGN PATENT DOCUMENTS

| 61-222225 | 10/1986 | Japan . |
| 63-088821 | 4/1988 | Japan . |
| 63-239937 | 10/1988 | Japan . |
| 1-55847 | 3/1989 | Japan . |
| 1-101648 | 4/1989 | Japan . |
| 4-221821 | 8/1992 | Japan . |
| 4-345025 | 12/1992 | Japan . |
| 6-112128 | 4/1994 | Japan . |
| 6-168883 | 6/1994 | Japan . |

Primary Examiner—John Niebling
Assistant Examiner—Thomas G. Bilodeau
Attorney, Agent, or Firm—Sughrue, Mion, Zinn, Macpeak & Seas, PLLC

[57] ABSTRACT

A method of forming a silicon-based thin film for burying contact holes having a high aspect ratio is disclosed. The method comprises the steps of forming contact holes in an insulating film provided on a semiconductor substrate, and growing a silicon-based (silicon or silicon alloys) film containing impurities by Chemical Vapor Deposition to bury the contact holes. The growth is performed by simultaneously feeding a material gas for forming the silicon-based film and an etching gas for etching the silicon-based film, where the material gas is fed under surface reaction limiting conditions to equalize gas concentrations inside and outside said contact holes, and the etching gas is fed under supply rate limiting conditions to make the gas concentration outside the contact hole higher than that at the bottom of the contact hole.

20 Claims, 5 Drawing Sheets

METHOD FOR PRODUCING SILICON FILM TO BURY CONTACT HOLE

BACKGROUND OF THE INVENTION

1. Field of the Invention

The present invention relates to a method for producing a semiconductor device, and more specifically to a method for burying contact holes using a silicon-based film.

2. Description of the Related Art

Silicon-based thin films are broadly used as materials for forming various electrodes, wiring materials and resistors used in semiconductor devices. For example, polycrystalline silicon films are applied to charge accumulating electrodes in memory devices, or to contact hole burying materials for connecting gates or device active layers to wiring layers. Since Ge has the same crystal structure as Si, and has a much lower resistivity than Si, Si—Ge alloys are often used as contact hole burying materials and the like. A conventional method for forming such silicon-based thin films has been the chemical vapor deposition (CVD) method using a silane-based material gas such as $SiH_4$, $Si_2H_6$, and a dopant gas. An example of the growth condition is disclosed in Japanese Patent Application Laid-Open No. 4-345025, which is a method for growing a polycrystalline silicon film under the conditions of a substrate temperature of 400°–460° C., a partial pressure of $Si_2H_6$ of 0.5 Torr or more, and a partial pressure of $PH_3$ of 6.5 Torr. Also, a method for burying contact holes that exposes device element regions in an insulating film is disclosed, for example, in Japanese Patent Application Laid-Open No. 4-221821, which describes a method for selectively growing a $Si_{0.6}Ge_{0.4}$ film only on element regions using $SiH_4$ and $GeH_4$ as material gases at a substrate temperature of 600° C. under a pressure of $1 \times 10^{-5}$ Torr.

BRIEF SUMMARY OF THE INVENTION

Recent progress in the degree of integration of integrated circuits have led to the reduction of element size, the formation of three-dimensional structures, decrease in the area of contact holes, and increase in the height of contact holes, i.e., increase in the aspect ratio of contact holes. In a memory device formed with the design rule of 0.2 $\mu$m or less, for example, a contact hole with an aspect ratio of about 10 is required. Among the conventional burying methods described above, the burying method using the silicon-based film, is not capable of burying contact holes having such high aspect ratio with a satisfactory high coverage.

This is because for contact holes having a high aspect ratio, the film growth rate decreases toward the bottom of the hole as a result of the gas concentration gradient which decreases from the entrance of a contact hole toward the bottom, due to the difficulty in supplying the material gas into minute holes. Furthermore, in the case of a contact hole having an inverse taper in which the diameter in the vicinity of the entrance is smaller than the diameter inside the hole, the contact hole cannot be buried completely even if the film is grown under conditions that equalize gas concentrations inside and outside the hole. Further, in the related art utilizing the selective growth method, if the surface of the interlayer film and the sidewall of the contact hole are insulating films, the contact hole may be buried with a high coverage. However, in case of an extremely minute contact hole formed by growing, after hole formation, a polycrystalline silicon film over the entire interlayer film surface after hole formation and then etching back so as to reduce the hole diameter to one less than that limited by photolithography, the surface of the interlayer film and the sidewall of the hole all consist of the polycrystalline silicon film. Since the selective growth techniques cannot be used for burying contact holes having such a structure, related art methods using selective Si—Ge growth cannot be applied.

As explained above, semiconductor devices in which contact holes having a high aspect ratio are buried using the related art method for forming silicon-based films have the problem of the deterioration of performances caused by poor coverage, namely, low product yield due to insufficient contact or low operating speed due to increase in contact resistance.

It is an object of the present invention to solve the aforementioned problems in the related art methods, and to provide a method for producing a semiconductor device enabling contact holes to be buried by a silicon-based film with high coverage, regardless of the shape of the contact holes, and the material of the sidewall of the holes.

SUMMARY OF THE INVENTION

The method for producing a semiconductor device of the present invention is characterized by a method comprising the steps of forming contact holes in an insulating film provided on a semiconductor substrate, and growing a silicon-based (silicon or silicon alloys) film containing impurities using the CVD method to bury said contact holes, wherein the growth of said silicon-based film is performed by simultaneously feeding a material gas for forming said silicon-based film and an etching gas for etching said silicon-based film. The material gas is fed under surface reaction rate limiting high flow rate conditions in order to equalize material gas concentrations inside and outside the contact holes, and the etching gas is fed under supply rate limiting low flow rate conditions in order to make the etching gas concentration outside said contact hole high and the gas concentration at the bottom of said contact hole low.

The reason for the poor coverage of conventional methods for burying contact holes is that the growth rate outside the contact holes is higher than that inside the contact holes because it is difficult to supply gases into minute contact holes. Since the film growth rate is determined by the supply of gas, growth under this conventional growing conditions is called the growth in the gas supply rate limited region. In this region, the growth rate increases with increase in the supply of the material gases. When the supply of the material gases is further increased, the growth rate reaches saturation at a certain gas flow rate. The growth under growth rate saturated conditions is called the growth in the surface reaction rate limited region. Therefore, if the flow rate of material gases is increased so that the film is grown under conditions in which the growth at the location of the lowest gas concentration in contact holes becomes the surface reaction rate limited growth, the growth rates inside and outside the contact holes are equalized, and film coverage is improved.

However, even if the film is grown in the surface reaction rate limited region, the contact holes having an inverse taper shape, in which the diameter of the entrance of a hole is smaller than the diameter of the bottom of the hole, cannot be buried completely, because the entrance of the hole becomes filled before the entire hole is buried.

According to the present invention, a reaction gas (etching gas) having the effect of etching the film is supplied together with the material gases for forming the film under the following conditions. The flow rate of the etching gas is low in order to make the etching gas concentration outside the holes higher than the etching gas concentration inside the holes (the condition under which the etching rate is determined by the amount of the supplied etching gas). Under this gas supply rate limiting condition, the film etching rate outside the holes is higher than the etching rate inside the holes. Since the net growth rate of the film is the film growth rate by material gases less the etching rate, if the amount of supplied material gases is made the surface reaction rate-determined region and the amount of the etching gas is made the gas supply rate-determined region, the net growth rate in the vicinity of the entrance of a hole can be lower than the growth rate inside the hole. As a result, even contact holes having an inverse taper shape may be buried by the silicon-based film completely.

It is preferred to use gases less reactive on the surface for securing the condition of surface reaction rate-determining region for material gases, and a gas more reactive with the film surface for obtaining the gas supply rate-determined conditions for the etching gas.

BRIEF DESCRIPTION OF THE DRAWINGS

This above-mentioned and other objects, features and advantages of this invention will become more apparent by reference to the following detailed description of the invention taken in conjunction with the accompanying drawings, wherein.

DETAILED DESCRIPTION OF THE PREFERRED EMBODIMENTS

Figure 1A:
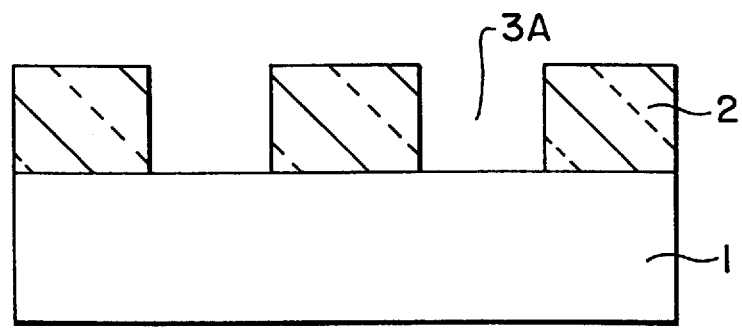
FIGS. 1(a)–1(c) are sectional views of a semiconductor chip for illustrating the first embodiment of the present invention.
Figure 1B:
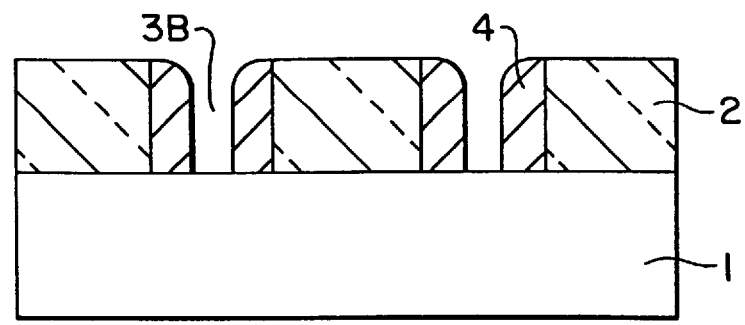
Figure 1C:
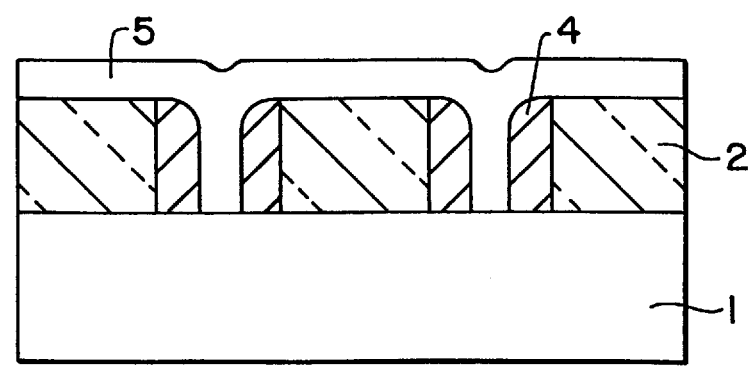

The present invention will be described referring to the drawings. FIGS. 1(a)–1(c) are sectional views of a semiconductor chip for illustrating the first embodiment of the present invention.

As FIG. 1(a) shows, a silicon oxide film 2 of a thickness of 1 μm is formed on a P-type silicon substrate 1 having surface orientation of [100] and a resistivity of 10 Ω-cm. Then contact holes 3A, each having a diameter of 0.5 μm are formed in the silicon oxide film 2 using photolithography.

Then, as FIG. 1(b) shows, a polycrystalline silicon film 4 is grown over the entire surface by the LPCVD method to a thickness of 0.2 μm, and then the polycrystalline silicon film is etched back by 0.2 μm to form contact holes 3B having an aspect ratio of about 10. With this condition for forming the contact hole, the diameter at the entrance of the holes is 0.15 μm and the diameter at the bottom of the holes is 0.1 μm.

Next, as FIG. 1(c) shows, the contact holes are buried by an amorphous silicon film 5 using an ordinary vertical LPCVD equipment at a temperature of 550° C. under a pressure of 20 Pa, and with $SiH_4$ gas as the material gas, 4% $PH_3$ (He base) gas as the dopant gas, and $Cl_2$ gas as the etching gas. The flow rate of the $PH_3$ gas is 50 sccm. Then, heat treatment for crystallization of the amorphous silicon film 5 is performed at 850° C. for 30 minutes to form an N-type polycrystalline silicon film.

Figure 2:
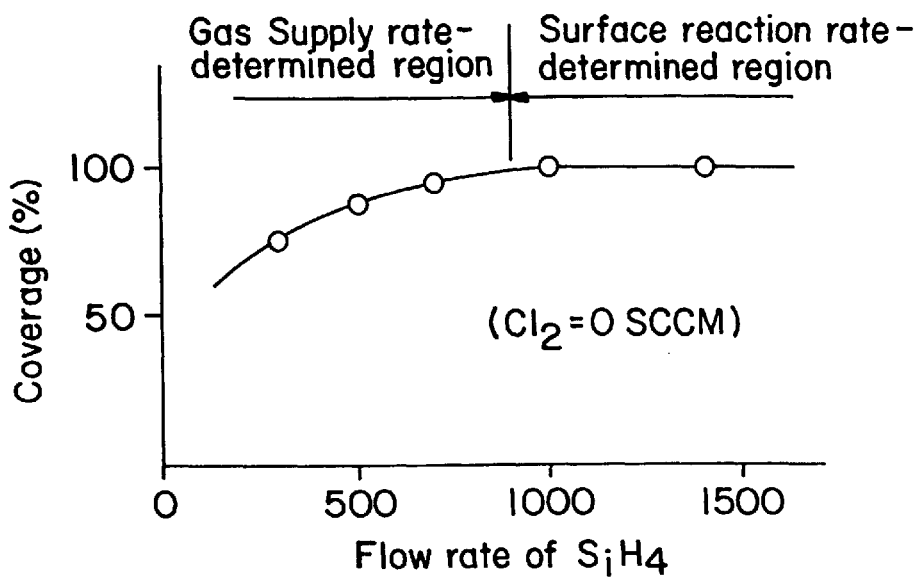
FIG. 2 is a graph showing relationship between the coverage of the silicon film and the flow rate of $SiH_4$ in this embodiment.
Figure 3:
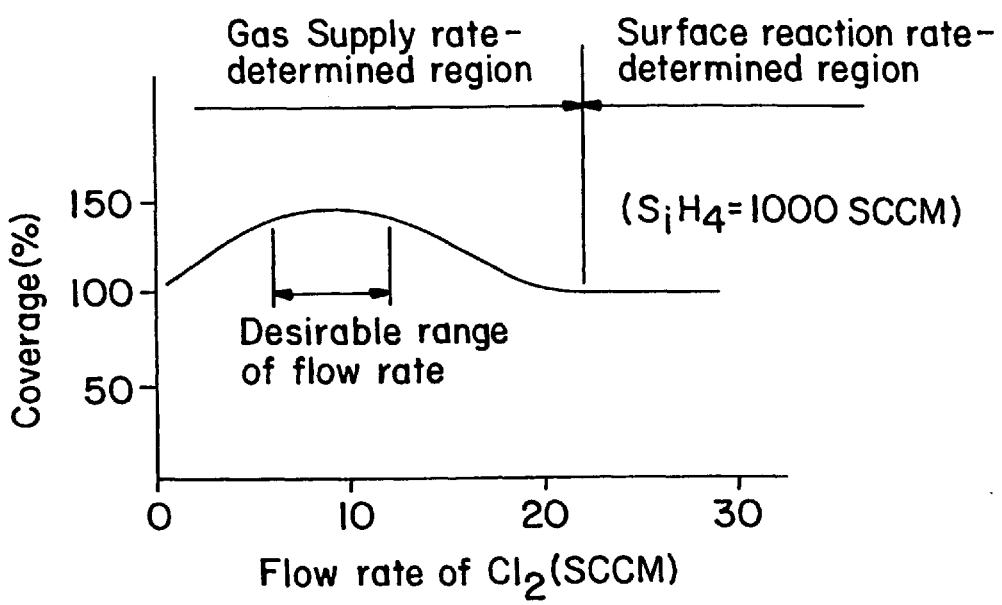
FIG. 3 is a graph showing relationship between the coverage of the silicon film and the flow rate of $Cl_2$ in this embodiment.

FIGS. 2 and 3 show the variation of coverage (the thickness of the film at the bottom of the hole)/(the thickness of the film outside the hole) of the polycrystalline silicon films after the heat-treatment when the flow rate of $SiH_4$ gas and $Cl_2$ gas is changed. The observation was made using a scanning electron microscope. It was confirmed that 100% coverage was obtained by supplying $SiH_4$ gas in the surface reaction rate limiting region and $Cl_2$ gas in the gas supply rate limiting region.

Figure 4A:
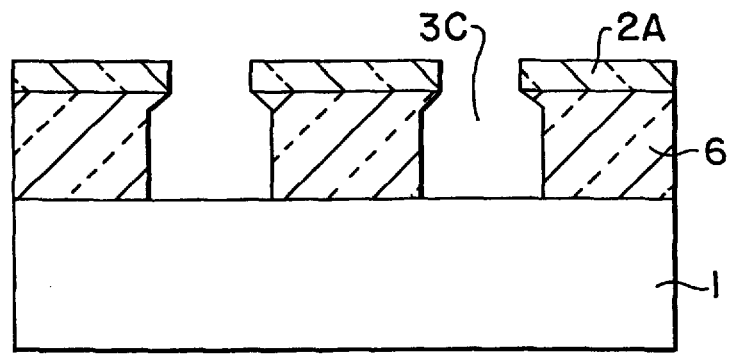
FIGS. 4(a)–4(c) are sectional views of a semiconductor chip for illustrating the second embodiment of the present invention.
Figure 4B:
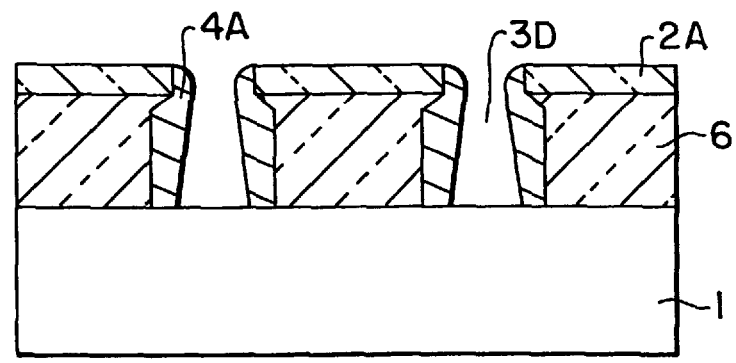
Figure 4C:
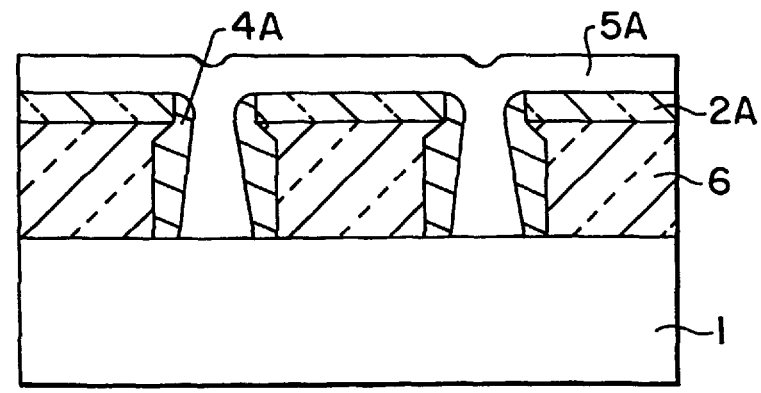

FIGS. 4(a)–4(c) are the sectional views of a semiconductor chip for illustrating the second embodiment of the present invention.

As FIG. 4(a) shows, a boron silicate glass (BSG) film 6 of a thickness of 0.8 μm is formed on a P-type silicon substrate 1 having a surface orientation of [100] and a resistivity of 10 Ω-cm, then a silicon oxide film 2A having a thickness of 0.2 μm is further formed to form an interlayer film having a thickness of 1.0 μm. Next, contact holes 3C each having a diameter of about 0.5 μm are formed by continuously etching the silicon oxide film 2A and the BSG film 6 using photolithography. Since the etching rate of the BSG film 6 is higher than that of the oxide film, the contact holes have narrow entrances and wider bottoms.

Then, as FIG. 4(b) shows, a polycrystalline silicon film 4A is grown over the entire surface by the LPCVD method to a thickness of 0.2 μm and the polycrystalline silicon film is then etched back by 0.2 μm to form contact holes 3D each having an aspect ratio of about 10. With this condition for forming the contact hole, the diameter of the entrance of the holes is 0.1 μm and the diameter of the bottom of the holes is 0.15 μm.

Next, as FIG. 4(c) shows, the contact holes are buried by an amorphous silicon film 5A using an ordinary vertical LPCVD equipment at a temperature and pressure in the reaction tube of 550° C. and 20 Pa, respectively, and with 1,000 sccm of $SiH_4$ gas as the material gas, 50 sccm of 4% $PH_3$ (He base) gas as the dopant gas, and 10 sccm of $Cl_2$ gas as the etching gas. Then, heat treatment for crystallization at 850° C. for 30 minutes is performed to form an N-type polycrystalline silicon film.

When the contact holes formed by the above method were evaluated by a scanning electron microscope, it was confirmed that contact holes having a diameter of the entrance of a hole smaller than the diameter inside the hole as shown in FIG. 4(c) were completely filled with the Si film.

Next, the third embodiment of the present invention will be described, in which contact holes are buried with a SiGe alloy film.

As FIG. 4(b) shows, contact holes each having an aspect ratio of about 10 are formed using the same process as in the second embodiment. The diameter of the entrance of the holes is 0.1 μm and the diameter of the bottom of the holes is 0.15 μm.

Next, the contact holes are buried by an amorphous $Si_{1-x}Ge_x$ (x=0.2) film using an ordinary vertical LPCVD equipment at a temperature and pressure in the reaction tube of 550° C. and 30 Pa, respectively, and with 500 sccm of $SiH_4$ gas and 10 sccm of $GeH_4$ as material gases, 5 sccm of 1% $PH_3$ (He base) gas as the dopant gas, and 10 sccm of $Cl_2$ gas as the etching gas. Then, heat treatment for crystallization at 700° C. is performed for 30 minutes to form an N-type polycrystalline $Si_{1-x}Ge_x$ (x=0.2) film.

When the contact holes formed by the above method were evaluated by a scanning electron microscope, it was confirmed that contact holes having a diameter of the entrance of a hole smaller than the diameter inside the hole were completely filled with the SiGe alloy film as in the second embodiment.

Figure 5A:
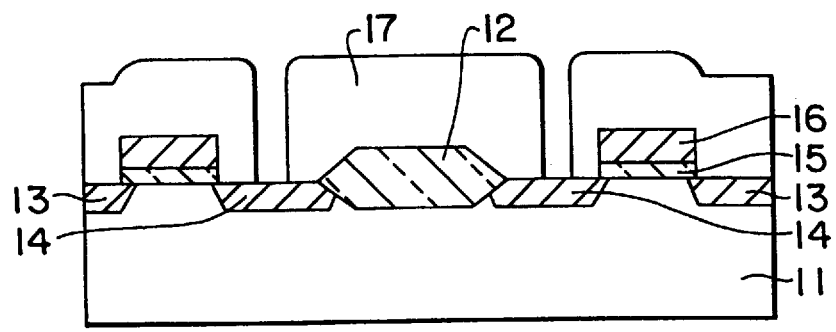
FIGS. 5(a) and 5(b) are sectional views of a semiconductor chip for illustrating the fourth embodiment of the present invention.
Figure 5B:
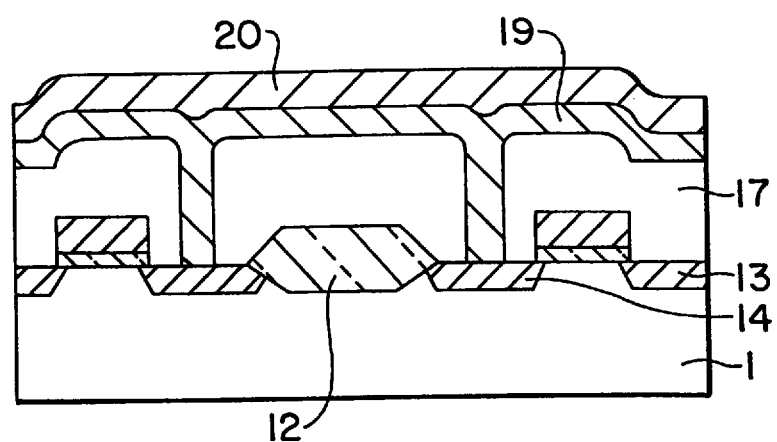

FIGS. 5(a) and 5(b) are sectional views of a semiconductor chip for illustrating the fourth embodiment of the present invention when the present invention is applied to MOS dynamic RAMs.

As FIG. 5(a) shows, a field oxide film 12 is formed on a P-type silicon substrate 11 having a surface orientation of [100] and a resistivity of 10 Ω-cm by the LOCOS (selective oxidation) method. Next a gate oxide film 15 and a gate electrode 16 are formed, then a source 13 and a drain 14 are formed to form a switching transistor element. Further, an interlayer insulating film 17 is formed by the CVD method, and capacitive contact holes (hole diameter of 0.1 $\mu$m) 18 for connection to the drain 14 is formed.

Next, as FIG. 5(b) shows, the contact holes are buried. The contact holes are completely buried using ordinary LPCVD equipment set at a furnace temperature of 550° C. and a vacuum of 20 Pa, supplying 1,000 sccm of $SiH_4$ gas as the material gas, 50 sccm of 4% $PH_3$ (He base) gas as the dopant gas, and 10 sccm of $Cl_2$ gas as the etching gas to form a phosphorus doped silicon film 19 having a thickness of 0.1 $\mu$m. Next, an amorphous silicon film of a thickness of 0.5 $\mu$m is formed on top by an ordinary method for forming phosphorus-doped Si films. Then, annealing for crystallization is performed at 850° C. for 30 minutes to crystallize the amorphous silicon film and electrically activated doped phosphorus atoms, forming a polycrystalline silicon film 20 having a thickness of 0.6 $\mu$m. Then, a MOS dynamic RAM is formed using a well-known process.

Since the RAM formed in the fourth embodiment had contact holes completely buried, no bit defects due to insufficient contact occurred, and product yield was improved. Also, since the contact holes were completely filled with the polycrystalline silicon film, and no voids were produced, the contact resistance was reduced, and performances such as the access time of the RAM were improved.

Figure 6:
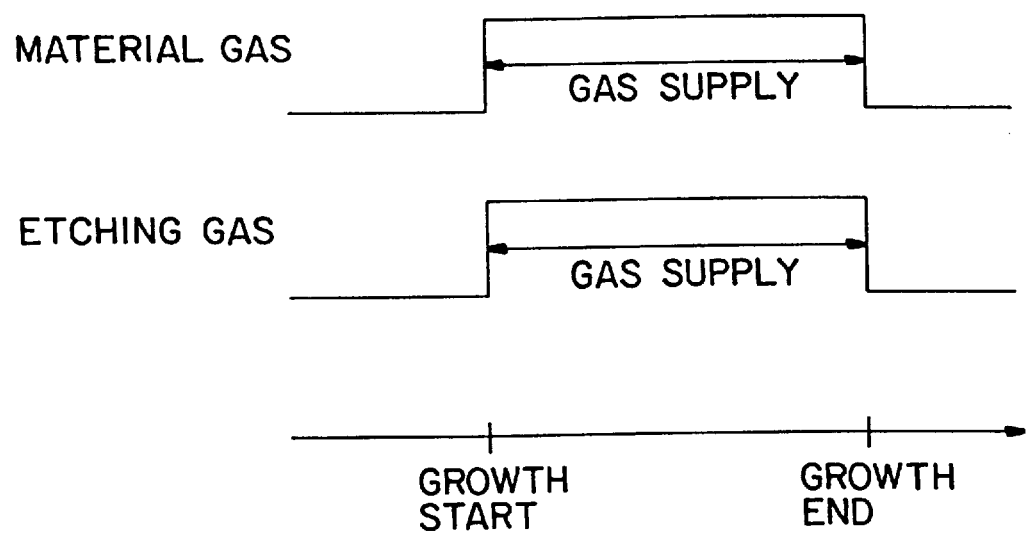
FIG. 6 illustrates feeding the material gas and the etching gas simultaneously during the entire time of silicon-based film growth.

In the above described embodiments, the material gas and the etching gas were both fed at all times during the growth of the silicon-based film. This situation is depicted in FIG. 6. However, it is also possible to accomplish the objects of this invention by having the etching gas fed simultaneously with the material gas for only a limited time period of the entire growth sequence.

Although $SiH_4$, $GeH_4$, $PH_3$, or $Cl_2$ are used in the above embodiments as reaction gases, $Si_2H_6$, $SiH_2Cl_2$, $SiHCl_3$, $SiCl_6$, $SiH_2F_2$, $GeCl_4$, or $GeF_4$ may be used as reaction gases for growing the film, $AsH_3$, $AsCl_3$, or $B_2H_6$ may be used as a doping gas, and HCl, $F_2$, $ClF_3$, or $NF_3$ may be used as an etching gas to form the film with sufficient coverage as in the embodiments, if reaction is performed in the surface reaction rate limited region for the growing gas, and in the gas supply rate limited region for the etching gas. Also, although LPCVD equipment is used as the growth equipment in these embodiments, UHV-CVD (ultra-high vacuum CVD) equipment or APCVD (atmospheric pressure CVD) equipment may be used for obtaining the same results.

According to the present invention, as described above, when burying contact holes provided in an interlayer film by silicon-based thin films containing impurities, contact holes having a high aspect ratio may be buried with sufficient coverage, by simultaneously supplying the material gases for forming the silicon-based film and an etching gas having the etching effect for the silicon-based film, and supplying the material gases under the surface reaction rate limiting conditions and the etching gas under the gas supply rate limiting conditions.

What is claimed is:

1. A method for producing a semiconductor device comprising the steps of:

forming in an insulating film provided on a semiconductor substrate, a contact hole having an opening, an inner sidewall and a depth reaching a bottom thereof;

growing a polycrystalline silicon film on the surface of said inner sidewall; and thereafter growing a silicon-based film to bury said contact hole, wherein the growth of said silicon-based film is performed by feeding a material gas for forming said silicon-based film and an etching gas for etching said silicon-based film simultaneously for a time period.

2. A method for producing a semiconductor device comprising the steps of:

forming a contact hole in an insulating film provided on a semiconductor substrate;

growing a silicon-based film containing dopant impurities using chemical vapor deposition to bury said contact hole, wherein the growth of said silicon-based film is performed by simultaneously feeding a material gas for forming said silicon-based film and an etching gas for etching said silicon-based film, said material gas being fed with substantially equal gas concentrations at the interior and exterior of said contact hole, and said etching gas being fed with a higher concentration at said exterior of said contact hole than at said bottom of said contact hole.

3. A method for producing a semiconductor device comprising the steps of:

forming a contact hole in an insulating film provided on a semiconductor substrate;

growing a silicon-based film containing dopant impurities using chemical vapor deposition to bury said contact hole, wherein the growth of said silicon-based film is performed by simultaneously feeding a material gas for forming said silicon-based film and an etching gas for etching said silicon-based film, said material gas being fed under gas supply rate limiting conditions in order to substantially equalize gas concentrations inside and outside said contact holes, and said etching gas being fed under gas supply rate limiting conditions in order to make said etching gas concentration outside said contact hole higher than said etching gas concentration at the bottom of said contact hole.

4. The method for producing a semiconductor device according to claim 1, wherein said growing of the silicon-based film is accomplished by chemical vapor deposition.

5. The method for producing a semiconductor device according to claim 3, wherein said gas supply rate limiting conditions for said material gas is accomplished by feeding said material gas with a sufficiently high flow rate, and said supply rate limiting conditions for said etching gas is accomplished by feeding said etching gas at a sufficiently low flow rate.

6. The method for producing a semiconductor device according to claim 1, wherein said material gas for forming said silicon-based film includes a gas selected from a group consisting of $SiH_4$, $Si_2H_6$, $SiH_2Cl_2$, $SiHCl_3$, $SiCl_4$, $SiH_2F_2$, $GeH_4$, $GeCl_4$, and $GeF_3$, and a gas selected from the group consisting of HCl, $Cl_2$, $F_2$, $ClF_3$, and $NF_3$ is used as said etching gas.

7. The method for producing a semiconductor device according to claim 2, wherein said material gas for forming said silicon-based film includes a gas selected from a group consisting of $SiH_4$, $Si_2H_6$, $SiH_2Cl_2$, $SiHCl_3$, $SiCl_4$, $SiH_2F_2$, $GeH_4$, $GeCl_4$, and $GeF_4$ and a gas selected from the group consisting of HCl, $Cl_2$, $F_2$, $ClF_3$, and $NF_3$ is used as said etching gas.

8. The method for producing a semiconductor device according to claim 1, wherein an impurity doping gas is fed at the same time with the material gas and the etching gas for adding impurities to said silicon-based film.

9. The method for producing a semiconductor device according to claim 2, wherein an impurity doping gas is fed at the same time with the material gas and the etching gas for adding impurities to said silicon-based film.

10. The method for producing a semiconductor device according to claim 3, wherein an impurity doping gas is fed at the same time with the material gas and the etching gas for adding impurities to said silicon-based film.

11. The method for producing a semiconductor device according to claim 2, wherein an N-type silicon-based film is grown by using phosphine ($PH_3$), arsine ($AsH_3$), or arsenic trichloride ($AsCl_3$) as the doping gas.

12. The method for producing a semiconductor device according to claim 3, wherein an N-type silicon-based film is grown by using phosphine ($PH_3$), arsine ($AsH_3$), or arsenic trichloride ($AsCl_3$) as the doping gas.

13. The method for producing a semiconductor device according to claim 2, wherein a P-type silicon-based film is grown by using diborane ($B_2H_6$) as the doping gas.

14. The method for producing a semiconductor device according to claim 3, wherein a P-type silicon-based film is grown by using diborane ($B_2H_6$) as the doping gas.

15. A method of producing a semiconductor device, comprising the step of:

forming a silicon-based film by simultaneously providing a material gas for forming said silicon-based film and an etching gas or etching said silicon-based film, wherein said material gas is supplied at a rate within the surface reaction rate limiting region and said etching gas is supplied at a rate within the gas supply rate limiting region.

16. The method for producing a semiconductor device according to claim 15, wherein said step of forming a silicon-based film further includes simultaneously providing a doping gas with said material gas and said etching gas, for doping said silicon-based film.

17. The method for producing a semiconductor device according to claim 15, wherein said silicon-based film forms a buried contact film of said semiconductor device.

18. The method for producing a semiconductor device according to claim 15, wherein said material gas for forming said silicon-based film includes a gas selected from a group consisting of $SiH_4$, $Si_2H_6$, $SiH_2Cl_2$, $SiHC_3$, $SiCl_4$, $SiH_2F_2$, $GeH_4$, $GeCl_4$, and $GeF_4$, and a gas selected from the group consisting of HCl, $Cl_2$, $F_2$, $ClF_3$, and $NF_3$ is used as said etching gas.

19. A method of producing a semiconductor device, comprising the steps of:

forming an insulating film on a semiconductor substrate, said insulating film having a contact hole with an opening, an inner sidewall and a depth reaching a bottom thereof;

growing a first semiconductor film on the surface of said inner sidewall; and forming a second semiconductor film to bury said contact hole, wherein the growth of said second semiconductor film is performed by feeding a material gas for forming said second semiconductor film and an etching gas for etching said second semiconductor film simultaneously for a time.

20. A method of producing a semiconductor device, comprising the step of:

forming a semiconductor film by simultaneously providing a material gas for forming said semiconductor film and an etching gas for etching said semiconductor film, wherein said material gas is supplied at a rate within the surface reaction rate limiting region and said etching gas is supplied at a rate within the gas supply rate limiting region.

* * * * *